United States Patent
Kolb et al.

(10) Patent No.: US 6,883,381 B2
(45) Date of Patent: Apr. 26, 2005

(54) ACCELERATION SENSOR AND METHOD FOR MANUFACTURING AN ACCELERATION SENSOR

(75) Inventors: Stefan Kolb, Unterschleissheim (DE); Wolfgang Werner, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/454,191

(22) Filed: Jun. 4, 2003

(65) Prior Publication Data
US 2004/0055385 A1 Mar. 25, 2004

(30) Foreign Application Priority Data
Jun. 4, 2002 (DE) .......................................... 102 24 790

(51) Int. Cl.[7] .............................................. G01L 9/00
(52) U.S. Cl. .............................. 73/754; 73/715; 73/727
(58) Field of Search ................................... 73/700–756

(56) References Cited

U.S. PATENT DOCUMENTS 4,625,560 A * 12/1986 Sanders ....................... 73/718
5,044,201 A * 9/1991 Farace et al. ................. 73/503
2001/0054315 A1  12/2001 Aigner et al.

FOREIGN PATENT DOCUMENTS

| DE | 32 28 149 A1 | 2/1984 | |
|---|---|---|---|
| DE | 691 26 501 T2 | 4/1992 | |
| DE | 198 39 122 A1 | 3/2000 | |
| EP | 0 480 471 B1 | 4/1992 | |
| EP | 571107 A1 * | 11/1993 | G01L/1/24 |

* cited by examiner

Primary Examiner—Edward Lefkowitz
Assistant Examiner—Jermaine Jenkins
(74) Attorney, Agent, or Firm—Laurence A. Greenberg; Werner H. Stemer; Gregory L. Mayback

(57) ABSTRACT

An acceleration sensor includes a deflectable pressure measuring diaphragm and a counter-structure, which is deflectable as against the pressure measuring diaphragm. The acceleration sensor includes a detection means for detecting a deflection of the pressure measuring diaphragm as against the counter-structure. Further, a test mass is connected to the pressure measuring diaphragm or the counter-structure in order to be deflected from an idle position depending on an acceleration applied. The deflection of the test mass results in a change of the distance between the pressure measuring diaphragm and the counter-structure, which is detectable by the detection means.

22 Claims, 2 Drawing Sheets

ACCELERATION SENSOR AND METHOD FOR MANUFACTURING AN ACCELERATION SENSOR

BACKGROUND OF THE INVENTION

1. Field of the Invention

The present invention relates to the field of acceleration sensors.

2. Description of the Related Art

Nowadays, acceleration sensors are increasingly used in many areas, and, in particular, in the field of automotive engineering. For example, acceleration sensors are used in motor vehicles as sensitive elements for applications such as airbags, knocking sensors or an intelligent vehicle chassis.

In state of the art, acceleration sensors are known to be formed of a spring and a suspended mass. A prior art acceleration sensor is described, for example, in Frank Goodenoogh, "Airbags boom when IC accelerometer sees 50 G", Electronic Design 45, 8 Aug. 1991. The acceleration sensor comprises a test mass which is connected to a substrate by means of springs, which, for example, are each arranged at opposing sides of a first and a second end of the test mass. When an acceleration or delay occurs, the test mass will be deflected, wherein a detection of the deflection may be effected on a capacitive basis or by means of the piezo effect.

In capacitive detection, the mass is typically implemented as a panel, which, together with an electrode opposing the panel, forms a capacitor. If the mass is deflected upon accelerating or delaying, the capacity of the capacitor will change such that the measured capacity represents a measure for acceleration. If resistors are applied to the springs, the deflection of the mass and thus the acceleration may also be measured by means of the piezo effect. Furthermore, in capacitive detection, the mass may also be implemented as a comb, the teeth of which are movably arranged between the electrodes. The arrangement of the teeth in the electrodes enables a sensitive detection, since a high capacity change is caused between the teeth and the electrodes when the mass is deflected.

Nowadays, the manufacture of the above-described acceleration sensor is typically performed by means of bulk-micromachining or surface micromachining.

Structures and manufacturing methods of prior art acceleration sensors are for example explained in the above-mentioned document.

Another type of sensitive elements adapted to be generated by micromechanical methods which are frequently used nowadays is represented by a pressure sensor. Nowadays, prior art pressure sensors are used, for example, in the field of automotive engineering as side-airbag sensors or for engine control.

The prior art pressure sensors comprise a diaphragm clamped on all sides and which bends upon pressure load. The diaphragm and the counter-structure typically define a hermetically sealed closed cavity comprising a vacuum or a very low pressure. A bending of the diaphragm results depending on the internal pressure of the cavity and the outer ambient atmospheric pressure applied to the diaphragm. Since the diaphragm is hermetically sealed as against the environment, the bending of the diaphragm represents a measure for the external pressure applied to the diaphragm. As in the case of prior art acceleration sensor, the bending may be detected on a capacitive basis or by means of the piezo effect.

A prior art pressure sensor, in which an evaluation circuit is monolithically integrated by means of silicon planar technology, is for example described in H.-J. Timme et al. "Monolithic Pressure Sensor Microsystems", Sensor 97 Int. Congress, Nuremburg, 13–15, May 1997.

In contrast to the above-described prior art acceleration sensors, in which, for increasing the sensitivity, the test mass should be as great as possible, it is considered advantageous to provide a possibly thin and low-weight diaphragm in the pressure sensor. This enables a high degree of flexibility of the diaphragm and further a low degree of influence if the pressure sensor is subjected to acceleration.

Further, for avoiding a contamination as a result of harmful substances or corrosion, a pressure sensor may be protected by means of a flowable filler, for example a gel. A sensor device, in which such a protective means is provided, is described, for example, in the document DE 196 26 086 A1.

A significant advantage of pressure sensors consists in that the same may be manufactured in an inexpensive and simple manner. In contrast to the acceleration sensors, in which extensive and precise etching processes for generating the thin springs are required, pressure sensors merely necessitate the generation of a diaphragm and a counter-structure.

In surface micromachining, generating the diaphragm and the counter-structure may be effected such that the sacrificial layer, which is arranged between the substrate and the diaphragm, is isotropically etched by means of etching holes which were generated in the diaphragm such that a cavity is formed in the sacrificial layer. Thereupon, the etching holes in the diaphragm will be closed. The sensitivity of the pressure sensor may be determined by providing trenches on an edge of the diaphragm. Further, a tab may be formed on the diaphragm which comprises oxide material, such as e.g. BPSG material (BPSG=phosphor silicon glass), plasma oxide or plasma nitride.

SUMMARY OF THE INVENTION

It is the object of the present invention to provide an acceleration sensor and a method for manufacturing an acceleration sensor, by means of which a simple and low-cost manufacture may be achieved.

In accordance with a first aspect of the invention, this object is achieved by an acceleration sensor comprising: a pressure measuring diaphragm; a counter-structure spaced from the pressure measuring diaphragm; a test mass which is connected to the pressure measuring diaphragm or to the counter-structure in order to be deflected from an idle position depending on the acceleration applied, with a deflection of the test mass leading to a change of a distance between the pressure measuring diaphragm and the counter-structure; and a detection means for detecting the distance or the change of the distance between the pressure measuring diaphragm and the counter-structure.

In accordance with a second aspect of the invention, this object is achieved by an acceleration sensor, comprising: a diaphragm; a counter-structure spaced apart from the diaphragm; an elastic test mass, which is connected to the diaphragm, in order to be deflected with respect to the counter-structure depending on the acceleration applied, with a deflection of the test mass resulting in a change in distance between the diaphragm and the counter-structure; and a detection means for detecting the change or the change of the distance between the diaphragm and the counter-structure.

In accordance with a third aspect of the invention, this object is achieved by a method for manufacturing an acceleration sensor from a pressure sensor structure with a pressure measuring diaphragm and a counter-structure, comprising the following steps: producing a test mass, which is connected to the pressure measuring diaphragm or the counter-structure, in order to be deflected from an idle position depending on an acceleration applied, with a deflection of the test mass resulting in a change of a distance between the pressure measuring diaphragm and the counter-structure; and providing a detection means for detecting the distance or the change of the distance of the pressure measuring diaphragm as against the counter-structure.

The present invention is based on the recognition that, by means of simple modifications, a low-cost pressure sensor may replace an expensive acceleration sensor. In accordance with the present invention an acceleration sensor may be formed from a pressure sensor-structure comprising a pressure measuring diaphragm and a counter-structure by connecting a test mass to the pressure measuring diaphragm or the counter-structure.

When an acceleration is applied, the test mass will be deflected from its idle position, thus causing a distance change between the pressure measuring diaphragm and the counter-structure, with the distance and/or the distance change being detectable by a detection means.

An advantage of the present invention consists in that the inventive acceleration sensor may be manufactured on a low-cost basis, since manufacturing a pressure sensor is inexpensive and simple.

A further advantage of the present invention consists in that, for manufacturing the inventive acceleration sensor, existing process operations may be used, which are applied when manufacturing a pressure sensor. As a result, manufacturing steps, such as e.g. a lithography and an etching, may be used both for manufacturing a pressure sensor and an acceleration sensor. This enables a flexibility of manufacture and sufficient utilization of apparatuses and process operations which may be used for manufacturing both a pressure sensor and an acceleration sensor. Further, the technical knowledge achieved for manufacturing the pressure sensor, in particular, for the error-prone lithography and etching processes, may be used for manufacturing the acceleration sensor. During a manufacture of the acceleration sensor, this saves the complex and time-consuming adjusting of process flow parameters and enables a high yield with low reject rates which can be immediately achieved.

In one embodiment, the acceleration sensor comprises a cap which, preferably, hermetically seals the acceleration sensor. As a result, the acceleration sensor may be protected from undesired influences by the environment, for example sound waves. Further, the cap ensures that the sensitivity of the sensor is not dependent on an external pressure, which may cause a bending of the diaphragm and a resulting change of the sensitivity.

A detection of a deflection of the pressure measuring diaphragm as against the counter-structure may for example include a capacitive detection and/or a detection based on the piezo effect. As a result, detection means and/or evaluation circuits provided for the pressure sensor structure may be used, whereby a new designing of the same is not required and manufacturing costs may be kept at a favorable level. The evaluation circuit may be integrated on the substrate such that, on the basis of the short connection between the detection means and the evaluation circuit, there will be hardly any influence on the measuring signal.

In one embodiment, the test mass is connected to the pressure measuring diaphragm such that the pressure measuring diaphragm acts as a deflection element which is deflected upon acceleration. In this embodiment, the test mass comprises an elastic material, such as e.g. a gel, or a liquid, with the elasticity of the elastic material being greater or equal to the elasticity of the diaphragm. Thus, it is ensured that the test mass does not have any or hardly any adverse effect on the deflectability of the diaphragm. Also, this adverse effect will not exist when the test mass is implemented as a liquid, such as e.g. oil, with the liquid being contained by a lateral container. Thus, the force acting onto the test mass as a result of acceleration may be transmitted onto the diaphragm in order to lead to a deflection of the diaphragm from its idle position.

The elastic test mass also ensures that the test mass produces the desired force effect onto the diaphragm which was caused by an inertia without significantly reducing an elasticity of the diaphragm. In contrast to using a rigid mass, this offers the advantage that the test mass may be applied to the diaphragm or onto the host sensor without any increase in the rigidity of the diaphragm. Further, the use of the elastic mass is advantageous in that the elastic test mass may be applied, for example as a layer, to the total surface of the diaphragm, as a result of which a simple coupling of the test mass to the pressure measuring diaphragm is achieved. As a result it is not necessary to perform a complex and difficult connecting of the mass to only one part of the pressure measuring diaphragm, for example the center of the diaphragm, as would be necessary in a rigid mass to ensure a deflectability of the diaphragm.

Applying the test mass to the whole surface further protects the diaphragm and/or other elements of the acceleration sensor, such as e.g. devices of circuits, from an oxidation or other external influences, such as, for example, a contamination with particles. The elastic test mass may further cause a dampening of external pressure influences, such that, in one embodiment, it is possible to operate the acceleration sensor without a hermetically sealed cap.

For reinforcing the sensitivity, the elastic test mass connected to the pressure measuring diaphragm may comprise a solid matter or solid matter particles, which preferably comprise a high specific gravity. In one embodiment, the elastic test mass includes a wafer made of heavy metal which is applied to the elastic test mass, for example by means of gluing.

The elastic mass can include a layer of a gel, for example silicon gel, with the same preferably comprising a thickness greater than 1 mm.

In an alternative embodiment of the present invention, the test mass is connected to the counter-structure of the pressure sensor structure. Here, the counter-structure has been processed to be deflectable. In this embodiment, the test mass may be massive and/or rigid with the rigid test mass being connected to the counter-structure such that the counter-structure is still deflectable. This is achieved in that the test mass does not extend over the whole counter-structure, such that the part of the counter-structure not connected to the test mass may deflect upon acceleration and ensures deflection of the test mass.

The counter-structure may further include perforations, as a result of which an increased deformability of the counter-structure and an enhanced sensitivity of the acceleration sensor is achieved. Moreover, the counter-structure may also include other structures or elements used in prior art acceleration sensors. For example, the counter-structure may include springs from which the test mass suspends.

In this embodiment, the test mass is preferably integrally formed with the deformable area of the counter-structure.

Starting from a prior art pressure sensor structure arranged on a substrate, this may be achieved by etching the substrate from the rear side to generate the deformable area and the test mass.

In the embodiments, in which the test mass is connected to the counter-structure the pressure measuring diaphragm spaced from the counter-structure may be used as a counter-electrode during a capacitive detection of the deflection of the test mass. Due to its low mass, the pressure measuring diaphragm essentially experiences no deflection upon an acceleration, such that, during the capacitive detection, only the deflection of the counter-electrode connected to the test mass will be detected. The manufacturing method is simplified by using the pressure measuring diaphragm as a counter-electrode for capacitive detecting, since no additional manufacturing steps for generating a counter-electrode are necessary.

BRIEF DESCRIPTION OF THE DRAWINGS

Preferred embodiments of the present invention will be explained in detail below with reference to the attached drawings, in which.

DETAILED DESCRIPTION OF PREFERRED EMBODIMENTS

Figure 1:
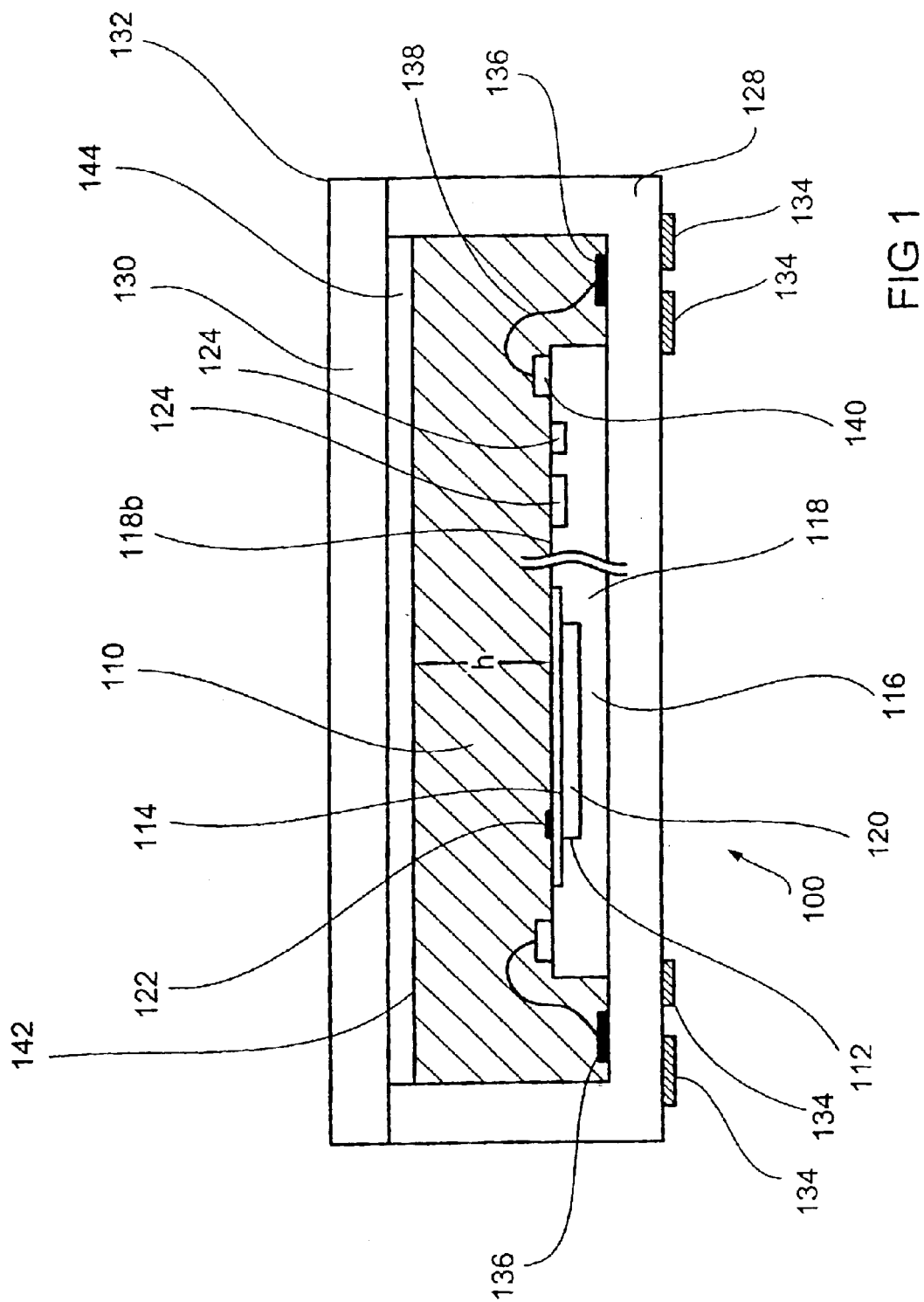
FIG. 1 shows a schematic cross-sectional illustration of an acceleration sensor in accordance with an embodiment of the present invention.

Referring to FIG. 1, an acceleration sensor 100 will be described below as an embodiment of the present invention, in which a test mass 110 connected to a pressure measuring diaphragm 114 comprises an elastic material.

In accordance with FIG. 1, the acceleration sensor 100 includes a pressure sensor structure 112 which includes the deformable pressure measuring diaphragm 114 and a counter-structure 116 opposing the pressure measuring diaphragm 114. In this embodiment, the counter-structure 116 includes a substrate 118, in which a recess 120 is formed. Preferably, the substrate 118 and the pressure measuring diaphragm 114 include a semiconductor material. For example, the substrate may include silicon, while the pressure measuring diaphragm 114 may comprise a polycrystalline silicon material. As will be explained in detail below, the acceleration sensor 100 is manufactured by means of semiconductor processing techniques which may include bulk-micromachining or surface micromachining.

As may be recognized in FIG. 1, the pressure measuring diaphragm 114 is arranged above the recess 120, with the pressure measuring diaphragm 114 preferably hermetically sealing the recess 120 such that a hermetically sealed cavity is formed as is required in a pressure sensor for measuring an external pressure. In a plan view, the pressure measuring diaphragm 114 and the recess 120 preferably comprise a circular shape, whereby a simple manufacture of the same is enabled, whereby the same, however, may include any other shape, for example an oblong shape.

The acceleration sensor 100 further includes a detection means 122 for detecting a deflection of the pressure measuring diaphragm as against the counter-structure. As is shown in FIG. 1, the detection means may comprise piezoelectric resistors arranged on the diaphragm. The piezoelectric resistors, which may for example be diffusion resistors, may be formed at each position of the diaphragm.

In other embodiments, the detection means may be implemented to carry out a capacitive detection of deflection of the pressure measuring diaphragm as against the counter-structure, as is also known in the state of the art. Further, the detection means may include any other known type of detection apparatuses, such as for example optical or inductive detection apparatuses, which are suitable for measuring a relative deflection of the pressure measuring diaphragm as against the counter-structure.

In the embodiment in accordance with FIG. 1, an integrated evaluation circuit 124 is further provided on the substrate 118 in order to evaluate a measuring signal in the substrate which is generated by the detection means 122. The evaluation circuit 124 may for example comprise reference resistors, which, together with the piezoresistive resistors, may be arranged in a bridge circuit. Further, the evaluation circuit 124 may include active devices, such as e.g. bipolar transistors or MOS transistors. The evaluation circuit 124 may further comprise an analog/digital converter means to digitize the measuring signal and carry out a digital rendering and evaluation.

The evaluation circuit 124 is connected to the detection means 122, for example, by means of conductor traces to receive the measuring signal from the same. The integration of the evaluation circuit 124 on the substrate enables a safe and low-noise detection, since a transmission of the measuring signal from the detection means 122 to the evaluation circuit 124 is kept short, such that the probability of any influence on the measuring signal by electromagnetic interference couplings is low.

As may be seen in FIG. 1, the substrate 118 is arranged on a lower housing section 128, which, together with an upper housing section 130, forms a housing 132. Preferably, the housing 132 provides a hermetically sealed implementation to prevent any influence from external quantities, for example, pressure sound waves or chemically active substances and particles. Further, the hermetical sealing prevents the elastic mass from drying up. In an alternative embodiment, the housing 132 may also be open, as a result of which a protection from external influences and, in particular, a sound impinging-onto the acceleration sensor may be achieved by the elastic test mass 110, as will be explained in detail below.

As can be recognized in FIG. 1, external terminal contacts 134 are arranged on an external surface of the lower housing section 128 which may be connected to an external processing or control unit. The external terminal contacts 134 are connected to interior terminal contacts 136, which, in turn, by means of an electric connection line 138, which, for example, may include an electrically conductive wire, are connected to pads 140, which are arranged on marginal areas of the substrate 118.

In the described embodiment in accordance with FIG. 1, the test mass 110 is formed as a layer of elastic material, which fills the entire interior of the housing 132 save for a cavity 144. Accordingly, the test mass layer extends across the entire pressure measuring diaphragm and the total of the main surface of the substrate 118, on which the pressure measuring diaphragm 114 and the evaluation circuit 124 are arranged. Filling the entire interior with the elastic test mass layer provides the advantage of a simple manufacturing process and simultaneously increases the stability of the test mass.

The test mass may comprise an elastic material, for example a gel, such as silicon gel, which, for increasing the specific gravity, may further comprise particles distributed in the gel, such as for example solid matter particles, preferably made of a material with a high specific gravity. For example, the elastic material may include particles of globules made of metal, which are preferably homogeneously distributed in the elastic material.

Further, in one embodiment, for reinforcing a deflection of the pressure measuring diaphragm 114, a massive solid matter, such as, for example, a metal plate, may preferably be arranged on an upper surface 142 of the test mass layer of an elastic material. If an acceleration occurs, the massive solid matter may exert an additional force onto the pressure measuring diaphragm 114 due to its inertial force, whereby an increase in deflection of the same is achieved. The massive solid matter, for example, may be also arranged in the test mass layer, wherein, however, an elastic mass should be provided between the solid matter and the diaphragm to prevent any influence on the pressure measuring diaphragm 114 by the solid matter.

In the following, an operation of the acceleration sensor in accordance with FIG. 1 will be discussed. If the acceleration sensor 100 is in an idle condition or if the acceleration sensor is moved at a constant speed, the pressure measuring diaphragm 114 comprises an idle position as against the counter-structure 116. If the acceleration sensor 100 is subjected to an acceleration or delay, the inertial force will act on each element of the acceleration sensor 100. The inertial force is proportional to the mass, such that due to the low mass for the pressure measuring diaphragm a low inertial force results without a test mass. In a prior art pressure sensor this causes the diaphragm to experience only a negligible bending with the usual accelerations. This is advantageous for a pressure sensor, since the same may detect a pressure without external influences by the acceleration.

However, in order to inventively use a pressure sensor as an acceleration sensor, a sufficiently large mass is coupled to the pressure measuring diaphragm 114 in the embodiment of FIG. 1 to achieve a sufficient degree of sensitivity. A planar coupling of a rigid mass to the pressure measuring diaphragm 114 is not advantageous, since the rigidness of the diaphragm would correspondingly increase. Further, applying the mass on a point-by-point basis in the center of the pressure measuring diaphragm 114 is complex and difficult to manufacture.

In order to achieve a reinforcement in deflection of the pressure measuring diaphragm 114 when an acceleration applied to the same, a test mass of an elastic material will be used in the acceleration sensor 100. As a result, the test mass, as is shown in FIG. 1, may be arranged across the full area of the diaphragm without significantly influencing a deformability of the pressure measuring diaphragm 114. If an acceleration occurs, this causes the pressure measuring diaphragm 114, owing the inertial force of the test mass 110, to experience an increased force and/or an increased pressure resulting in a detectable deflection of the pressure measuring diaphragm.

The deflection of the pressure measuring diaphragm 114 is detected by the detection means 122 which generates a measuring signal indicating the acceleration. The measuring signal is input into the evaluation circuit 124, which preferably comprises an analog/digital converter to carry out a digital rendering or processing of the measuring signals and to generate a digital output signal indicating the acceleration. The output signal generated by the evaluation means 124 is transferred to the external terminal contacts 134 via the pads 140 and the terminal contacts 136. The terminal contacts 134 may for example be connected to an input of a processing or control means, with the output signal being transferred to the processing or control means for further processing, for example, for controlling a triggering of an airbag.

In order to detect typical accelerations, as they occur, for example, in a motor vehicle, with sufficient sensitivity, it is necessary to suitably select and dimension the elastic mass. A typical and well-detectable value of a pressure of a pressure sensor in accordance with the pressure sensor structure 112 shown in FIG. 1 ranges at a diaphragm diameter of approximately 40 μm at approximately 0.1 bar. Further, a typical value in a measuring area of a typical acceleration sensor as is used in a motor vehicle, includes approximately 50 g (g=gravitational acceleration≈9.81 m/s²).

A pressure p being exerted onto the pressure measuring diaphragm 114 may be calculated in accordance with the following formula.

$$p = K/\Delta A = (m \times b)/\Delta A = (\Delta A \times h \times \rho \times b)/\Delta A$$

The expressions used in the above formula have the following meanings:
p=pressure
K=force
ΔA=surface
m=mass
b=acceleration
h=thickness of elastic mass
ρ=specific gravity From the above formula, the thickness of the elastic mass may be calculated, wherein:

$$h = p/(\rho \times b)$$

By means of the above-described values of the measuring areas of a prior art pressure sensor and a typical acceleration sensor, i.e. p=0.1 bar and b=50 g, and a typical specific gravity for silicon gel of 5 kg/dm³, a thickness of the elastic mass of 4 mm results from the above formula. The specific gravity of the elastic mass, as already mentioned above, may for example be changed by means of particles, such that the elastic mass may comprise a reduced thickness. Also, by providing a massive body, for example, a metal plate, the thickness of the elastic mass may be reduced. Owing to the above calculation, it may be concluded that it is easily possible for an elastic mass made of silicon gel with layer thicknesses greater than approximately 1 mm to use a pressure sensor for measuring accelerations.

In the embodiment described in FIG. 1, the acceleration sensor comprises a housing. In contrast to a pressure sensor of a similar structure, the acceleration sensor should preferably be hermetically sealed as against the environment of the same. The cavity 144 provided in the acceleration sensor 100 between the upper housing section 130 and the test mass layer made of an elastic material may be filled with gas or may even be evacuated. Further, the housing may be completely filled with the elastic mass. Under certain marginal conditions it is also possible not to hermetically seal the sensor or let the same open. These marginal conditions occur, if the impinging sound is strongly damped by the elastic mass, which is for example a gel, such that the pressure sensor will no longer generate any signal.

In accordance with the invention, the above-described acceleration sensor is manufactured based on a pressure sensor structure having a deflectable pressure measuring diaphragm and a counter-structure as against which the pressure measuring diaphragm may be deflected. The pressure sensor structure may be generated using the prior art methods, for example, bulk-micromachining or surface-micromachining. Preferably, the detection means is also generated prior to connecting the test mass. The detection means may be implemented corresponding to a pressure sensor detection means. This offers the advantage that the detection means may be generated already during the manufacture of the pressure sensor structure by means of the steps provided for the pressure sensor detection means, such that for generating the detection means no new manufacturing steps are necessary. Further, for example, in the case of a piezoresistive detection, it is not possible to generate the detection means after having applied test mass, if the test mass is connected to the full area of the pressure measuring diaphragm.

In order to generate the above-described acceleration sensor 100 from the pressure sensor structure, it is required to provide the test mass and to connect the same to the pressure measuring diaphragm. Connecting the test mass to the pressure measuring diaphragm may be effected in a simple manner, for example by filling the lower housing section with the elastic material, with the elastic material distributing over the pressure measuring diaphragm and the total acceleration sensor after filling.

Figure 2:
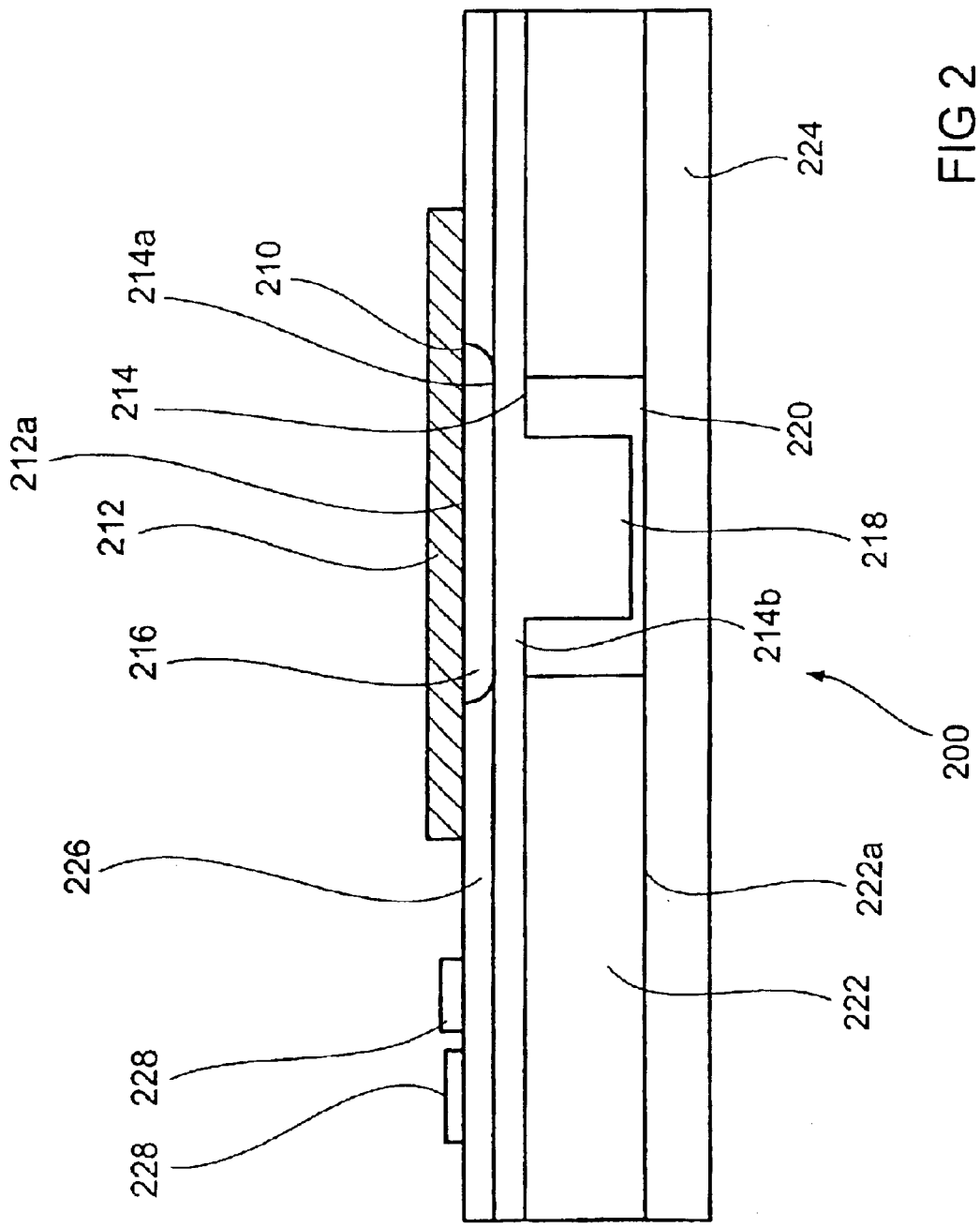
FIG. 2 shows a schematic cross-sectional representation of an acceleration sensor in accordance with a further embodiment of the present invention.

With reference to FIG. 2, a further embodiment of the present invention will be discussed below. In contrast to the embodiment in accordance with FIG. 1, it is the counter-structure of the pressure sensor structure and not the pressure measuring diaphragm that serves as a deflection element in this embodiment, the deflection element being deflected upon acceleration.

In accordance with FIG. 2, the acceleration sensor 200 comprises a pressure sensor structure 210 which includes a pressure measuring diaphragm 212 and a counter-structure 214. An upper surface 214a of the counter-structure 214 opposes a lower surface 212a of the pressure measuring diaphragm. In accordance with the embodiment of FIG. 1, the pressure sensor structure 210 comprises a pressure sensor cavity 216, which is constrained by the pressure measuring diaphragm 212 and the counter-structure.

In contrast to the embodiment in accordance with FIG. 1, the acceleration sensor 200 comprises a rigid test mass 218, with the rigid test mass 218 and the counter-structure 214 being preferably integrally formed. The test mass 218, which is located in a recess 220 of a substrate 222 is connected to a lower surface 214b of the counter-structure 214. The recess 220 is sealed by a cap 224, such that the recess 220 forms a cavity, which is preferably hermetically sealed.

In this embodiment, the counter-structure 214 further comprises a thin layer, which extends across the substrate 222. The substrate and the test mass may include a semiconductor material, such as, for example, silicon, with the pressure measuring diaphragm 212 also comprising a semiconductor material, for example, polycrystalline silicon.

In this embodiment, in contrast to the embodiment in accordance with FIG. 1, the counter-structure 214 formed by a thin layer serves as deflection element which experiences a bending upon acceleration of the acceleration sensor 200 and which, therefore, causes a deflection of the counter-structure relative to the pressure measuring diaphragm. In order to achieve such a bending, it is required that the counter-structure comprises a thin implementation. The counter-structure may, for example, be implemented as a thin layer, which preferably comprises a thickness of approximately 1 μm in order to enable the sufficient movability of the test mass 218. The thin counter-structure layer may completely cover the recess 220, as is shown in FIG. 2. For increasing a deflectability, the counter-structure may further include trenches. In one embodiment, the counter-structure 214 may further include a layer which serves as a stop layer when etching the substrate 222, as will be explained in detail below.

As is shown in FIG. 2, the test mass 218 may comprise a rigid mass, with the same, however, not being applied across the full area of the counter-structure 214. As a result, the counter-structure remains elastic in those areas which are not connected to the test mass 218, i.e., in this embodiment, in the lateral areas of the same, such that a deflection of the counter-structure as against the pressure measuring diaphragm 212 may occur, if an acceleration occurs. Preferably, the rigid test mass is centrally arranged on the counter-structure 214 to achieve a symmetric deflection of the counter-structure with respect to the pressure measuring diaphragm.

As in the embodiment explained with reference to FIG. 1, the test mass, however, may include an elastic mass, which is applied to the full area of the counter-structure. Further, in addition to the rigid test mass 218, an elastic test mass arranged in the recess 220 may also be provided, which effects an additional deflection of the counter-structure 218 during acceleration and further a stabilization of the test mass 218.

In an embodiment, the counter-structure 214 may comprise perforations in the area to which the test mass is not applied, whereby the counter-structure comprises an increased elasticity for deflection of the test mass. In other embodiments, the counter-structure 214 may also comprise elements and structures which are known from the state of the art for achieving a deflection upon acceleration. Such structures include, for example, a structure in which the test mass 218 suspends from elastic springs.

On the counter-structure 214, a further layer 226 is formed, in which the pressure sensor cavity 216 is arranged. As in the embodiment of FIG. 1, an integrated evaluation circuit is provided in the acceleration sensor 200, which is formed on the layer 226.

In accordance with the embodiment of FIG. 1, the acceleration sensor 200 may comprise prior art detection means, such as, for example, capacitive or piezoresistive detection means to detect the deflection of the counter-structure 214 relative to the pressure measuring diaphragm. As a result, an advantage of using a pressure sensor structure consists in that the pressure measuring diaphragm 214 may be used for detecting a deflection of the counter-structure 214. For example, the counter-structure 214 and the pressure measuring diaphragm 212 may be implemented to be conductive, such that a capacity is formed between the same, which may be used for detecting a deflection of the counter-structure 214 relative to the pressure measuring diaphragm 212. As a result, the layer 226 ensures the electrical insulation between the pressure measuring diaphragm 212 and the counter-structure 214. In this case, the pressure measuring diaphragm 212 acts as a counter-electrode, with the same, due to the reduced mass, not experiencing any significant deflection during acceleration such that, during acceleration, the capacity change indicates a deflection of the counter-structure 214.

If the pressure measuring diaphragm 212 is used as a counter-electrode for capacitive detection, the cavity 216 formed between the pressure measuring diaphragm 212 and the counter-structure 214 should preferably comprise a vacuum or be ventilated to avoid that a pressure change arises in the cavity 216 when the counter-structure 214 is deflected which may cause a change of the position of the pressure measuring diaphragm 212.

A further advantage of the use of the pressure sensor structure consists in that the pressure measuring diaphragm 212 acts as a cap which protects the counter-structure 214, for example, from undesired contaminations. Additionally, however, the acceleration sensor 200 may comprise a cap, as in the embodiment described with reference to FIG. 1, which hermetically seals the total acceleration sensor 200 including the pressure measuring diaphragm 212.

As shown in the embodiment of FIG. 2, if the test mass is connected to the counter-structure, the test mass and the counter-structure preferably comprise an integral implementation. The manufacture of such a structure will be explained in detail below.

A conventional pressure sensor manufactured by means of surface micromachining, which is arranged on a silicon substrate, represents the starting point of the following descriptions. In the method described hereinbelow, a stop layer is used, which, for example, may be arranged between the substrate 222 and the structure 214. With the known means of bulk-micromachining, the silicon substrate is etched from the rearside of the slice to the corresponding stop layer, such that a thin layer of silicon is formed, which, for example, comprises a thickness of approximately 1 $\mu$m and which acts as an elastic area of the counter-structure. This etching is preferably carried out as a dry etching process. Thus, small sensor dimensions may be achieved by means of correspondingly steep etching edges.

For carrying out this process, a mask is used, such that, via the mask, the test mass is generated in the thickness of the substrate which is surrounded by the thin area of the counter-structure. Via a further mask, the mass is preferably thinned by yet another few $\mu$m to achieve a free movability after the sealing of the sensor.

On the rearside, that is on the surface 222a, the sensor is hermetically sealed with a panel, which, for example, may be effected by bonding a slice of silicon to the surface 222a. The sensor may thus be advantageously sealed in a simple manner, for example, with a planar panel.

A further advantage of the above-described manufacturing method consists in that the prior art silicon technology may be used for manufacturing the sensor, with one advantage consisting in that the deflectable element may comprise the mechanically ideal monocrystalline silicon.

In the above-described manufacturing method, the formed thin area of the counter-structure may be further subjected to a further etching process to generate structures, such as, for example, perforations in the thin area, or elastic webs. The structures generated serve for increasing a deformability of the thin area, as a result of which the sensitivity is increased.

In order for the acceleration sensor manufactured from the pressure sensor structure being actually be suitable for the measuring of accelerations, the test mass generated in the counter-structure is appropriately dimensioned. This will be discussed in detail below.

Assuming the force F acting onto the deflectable element upon an acceleration a, the following expression ensues with the density $\rho$ and the volume V of the test mass:

$$F = \rho \cdot V \cdot a$$

Assuming that the test mass as well as the thin area around the test mass comprise a round shape and that the test mass further extends across a very wide area of the counter-structure, it is possible to set the diameter of the test mass approximately equal to the diameter of the counter-structure for determining the volume of the test mass. Assuming a counter-structure having a diameter of 2 mm, the diameter of the test mass consequently also results in approximately 2 mm. Taking a value of 50 g which is typical for the measuring area of an acceleration sensor, a force of $2.5 \cdot 10^{-3}$ N results with a density of silicon of 2.33 g/cm$^3$ according to the above formula.

In accordance with the known formula p=F/A, the pressure onto the counter-structure may be calculated, with a value of 8 mbar resulting for the above values. This value ranges within a measuring area, which may be detected by prior art pressure sensors. In accordance with the above calculations, forces and/or pressures thus result for a typical measuring area value of an acceleration sensor which can be detected with conventional pressure sensors, whereby it is shown that the acceleration sensor is suitable for typical applications, such as, for example, as airbag sensor in a motor vehicle.

In summary, it will be appreciated that the pressure sensor is inventively modified in that a test mass is applied to the pressure measuring diaphragm, such that a deflection of the diaphragm is proportional to the acceleration or that the counter-structure is elastically implemented and is provided with a test mass, such that the deflection of the counter-structure with respect to the pressure measuring diaphragm is proportional to the acceleration.

While this invention has been described in terms of several preferred embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

What is claimed is:

1. An acceleration sensor, comprising:
   a pressure measuring diaphragm;
   a deflectable counter-structure spaced from the pressure measuring diaphragm;
   a test mass connected to the deflectable counter-structure in order to be deflected from an idle position depending on the acceleration applied, a deflection of the test mass leading to a change of a distance between the pressure measuring diaphragm and the deflectable counter-structure; and
   a detection means for detecting the distance or the change of the distance between the pressure measuring diaphragm and the deflectable counter-structure.

2. The acceleration sensor in accordance with claim 1, further comprising a cap.

3. The acceleration sensor in accordance with claim 2, wherein the cap is formed to hermetically seal the acceleration sensor.

4. The acceleration sensor in accordance to claim 1, further comprising an evaluation circuit integrated on a substrate for evaluating a signal generated by the detection means.

5. The acceleration sensor in accordance with claim 1, wherein the detection means includes a piezoresistive resistor.

6. The acceleration sensor in accordance to claim 1, wherein a capacity is formed between the pressure measuring diaphragm and the deflectable counter-structure, with the detection means being implemented to detect a change in capacity.

7. The acceleration sensor in accordance with claim 1, wherein the test mass includes a rigid mass which is connected to the deflectable counter-structure.

8. The acceleration sensor in accordance with claim 7, wherein the test mass and the deflectable counter-structure are integrally implemented.

9. The acceleration sensor in accordance with claim 1, wherein the test mass includes an elastic material or a liquid.

10. The acceleration sensor in accordance with claim 9, wherein the test mass includes an elastic material and solid matter particles, the solid matter particles having a material different from the elastic material and being distributed within the elastic material.

11. The acceleration sensor in accordance with claim 9, further comprising a solid matter connected to the test mass made of an elastic material.

12. The acceleration sensor in accordance with claim 9, wherein the elastic material is available in a layer of the pressure measuring diaphragm and a thickness of the layer is greater than 1 mm.

13. A method for manufacturing an acceleration sensor from a pressure sensor structure with a pressure measuring diaphragm and a deflectable counter-structure, comprising the following steps:

producing a test mass connected to the deflectable counter-structure, in order to be deflected from an idle position depending on an acceleration applied, a deflection of the test mass resulting in a change of a distance between the pressure measuring diaphragm and the deflectable counter-structure; and providing a detection means for detecting the distance or the change of the distance of the pressure measuring diaphragm as against the deflectable counter-structure.

14. The method in accordance with claim 13, further comprising the step of generating a cap for hermetically sealing the acceleration sensor.

15. The method in accordance with claim 13, wherein the step of providing a test mass includes providing a test mass made of an elastic material.

16. The method in accordance with claim 13, wherein the step of providing a test mass includes providing a rigid test mass which is connected to the deflectable counter-structure.

17. The method in accordance with claim 16, wherein the pressure sensor structure includes a substrate with a first surface, from which the pressure measuring diaphragm is spaced apart, and with a second surface opposing the first surface, the step of providing the test mass including the following steps:

generating a mask on the second surface;

partially etching the substrate using the mask, whereby, in the deflectable counter-structure, a deflectable area and the test mass are generated.

18. The method in accordance with claim 17, further comprising the following steps:

back-etching of the test mass; and sealing the second surface.

19. An acceleration sensor, comprising:

a diaphragm;

a counter-structure spaced apart from the diaphragm;

an elastic test mass including an elastic material and solid matter particles, the solid matter particles having a material different from the elastic material and being distributed within the elastic material, the test mass being connected to the diaphragm, in order to be deflected with respect to the counter-structure depending on the acceleration applied, a deflection of the test mass resulting in a change in distance between the diaphragm and the counter-structure; and a detection means for detecting the change or the change of the distance between the diaphragm and the counter-structure.

20. The acceleration sensor in accordance with claim 19, wherein the elastic test mass includes a gel and solid matter particles distributed within the gel.

21. The acceleration sensor in accordance with claim 19, wherein the diaphragm is implemented as a pressure measuring diaphragm.

22. The acceleration sensor in accordance with claim 19, wherein an elasticity of the elastic test mass is greater or equal to an elasticity of the diaphragm.

* * * * *